United States Patent
Min

(10) Patent No.: US 7,180,150 B2
(45) Date of Patent: Feb. 20, 2007

(54) CMOS IMAGE SENSOR AND METHOD FOR DETECTING COLOR SENSITIVITY THEREOF

(75) Inventor: Wi Sik Min, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 214 days.

(21) Appl. No.: 10/901,381

(22) Filed: Jul. 29, 2004

(65) Prior Publication Data

US 2005/0145904 A1 Jul. 7, 2005

(30) Foreign Application Priority Data

Dec. 31, 2003 (KR) .................. 10-2003-0101663

(51) Int. Cl.
*H01L 31/00* (2006.01)
(52) U.S. Cl. .............. 257/440; 257/292; 257/461; 257/E31.052
(58) Field of Classification Search ........ 257/292, 257/432.44, 444, 461, E31.052, E31.057
See application file for complete search history.

(56) References Cited

U.S. PATENT DOCUMENTS

| 3,976,361 | A | * | 8/1976 | Fraas et al. ............. 349/26 |
| 4,450,466 | A | * | 5/1984 | Nishizawa et al. ........ 257/292 |
| 6,081,018 | A | * | 6/2000 | Nakashiba et al. ........ 257/435 |
| 6,266,038 | B1 | * | 7/2001 | Yoshida et al. ........... 345/92 |

FOREIGN PATENT DOCUMENTS

JP 60257559 A * 12/1985

* cited by examiner

*Primary Examiner*—N. Drew Richards
(74) *Attorney, Agent, or Firm*—Finnegan, Henderson, Farabow, Garrett, & Dunner, L.L.P.

(57) ABSTRACT

A CMOS image sensor and a method for detecting color sensitivity of red, green and blue light without using a color filter layer is disclosed, which includes a semiconductor substrate having an active region; a photodiode formed in the active region of the semiconductor substrate, and generating an optical electric charge in accordance with irradiation of light; an insulating interlayer formed on an entire surface of the semiconductor substrate; and a micro lens formed on the insulating interlayer in perpendicular to the photodiode, wherein, a back-bias voltage is applied to the semiconductor substrate to vary a width of a depletion area of the photodiode.

11 Claims, 7 Drawing Sheets

CMOS IMAGE SENSOR AND METHOD FOR DETECTING COLOR SENSITIVITY THEREOF

This application claims the benefit of the Korean Application No. P2003-101663 filed on Dec. 31, 2003, which is hereby incorporated by reference.

BACKGROUND OF THE INVENTION

1. Field of the Invention

The present invention relates to a CMOS (Complementary Metal Oxide Silicon) image sensor, and more particularly, to a CMOS image sensor and a method for detecting color sensitivity of red, green and blue light without using a color filter layer.

2. Discussion of the Related Art

Generally, an image sensor is a semiconductor device for converting an optical image into an electric signal. The image sensor can be broadly categorized into a charge coupled device (CCD) and a complementary metal oxide semiconductor (CMOS) image sensor.

The charge coupled device (CCD) includes a plurality of photodiodes (PD) aligned in matrix-type configuration and converting light signals into electric signals, a plurality of vertical charge coupled devices (VCCD) formed between each vertical photodiode aligned in a matrix-type configuration and vertically transmitting electric charges generated from each photodiode, a horizontal charge coupled device (HCCD) horizontally transmitting the electric charges transmitted by each of the vertical charge coupled devices (VCCD), and a sense amplifier sensing and outputting the horizontally transmitted electric charges.

However, the charge coupled device (CCD) has disadvantages of a complicated driving method, high power consumption, and a complicated fabrication process requiring a multi-phased photo process. In the charge coupled device (CCD), a control circuit, a signal processing circuit, an analog to digital (A/D) converter circuit, and so on cannot be easily integrated into a charge coupled device chip, thereby having the problem of forming compact-size products.

Recently, the complementary metal oxide semiconductor (CMOS) image sensor has been considered to be the next generation image sensor that can resolve the problems and disadvantages of the charge coupled device (CCD). The CMOS image sensor is a device adopting a CMOS technology using the control circuit, the signal processing circuit, and so on as a peripheral circuit, so as to form MOS transistors corresponding to the number of unit pixels on a semiconductor substrate, in order to sequentially detect the electric signals of each unit pixel by using a switching method, thereby representing an image.

Since the CMOS image sensor uses a CMOS fabrication technology, the CMOS image sensor is advantageous in that it has low power consumption and has a simple fabrication method through less photo process steps. In the CMOS image sensor, a control circuit, a signal processing circuit, an A/D converter circuit, and so on can be integrated in a CMOS image sensor chip, thereby enabling the product to be fabricated in a compact size. Accordingly, the CMOS image sensor is currently being extensively used in various applied technologies, such as digital still cameras and digital video cameras.

A general CMOS image sensor will now be described with reference to the accompanying drawings.

FIG. 1 is an equivalent circuit diagram of one unit pixel in a general CMOS image sensor. FIG. 2 is a cross-sectional view of a related art CMOS image sensor.

Referring to FIG. 1, a unit pixel of a general CMOS image sensor is formed of one photodiode (PD) and three nMOS transistors (T1, T2, and T3). A cathode of the photodiode (PD) is integrated to a drain of the first nMOS transistor (T1) and a gate of the second nMOS transistor (T2). Also, sources of both first and second nMOS transistors (T1 and T2) are connected to a power line supplying a reference voltage (VR). A gate of the first nMOS transistor (T1) is connected to a reset line providing a reset signal (RST). Then, a source of the third nMOS transistor (T3) is connected to a drain of the second nMOS transistor (T2), the drain of the third nMOS transistor (T3) is connected to a reading circuit (not shown) through a signal line, and the gate of the third nMOS transistor (T3) is connected to a column select line providing a select signal (SLCT). Therefore, the first nMOS transistor (T1) is referred to as a reset transistor, the second nMOS transistor (T2) is referred to as a driving transistor, and the third nMOS transistor (T3) is referred to as a selecting transistor.

The structure of the CMOS image sensor will now be described in detail.

Referring to FIG. 2 illustrating a photodiode region, an active region and a field region are defined on a p-type semiconductor substrate 10, and an isolation barrier 11 is formed in the field region. Then, n-type impurity ions are implanted into areas for photodiodes of the active region, thereby forming photodiodes PD 13a, 13b and 13c for a photodiode array 13.

After that, a transparent insulating interlayer 15 is formed on an entire surface of the p-type semiconductor substrate 10 including the photodiode array 13, and color filter layers of red, green and blue 17a, 17b and 17c for a color filter array 17 are formed on the transparent insulating interlayer 15 corresponding to the photodiodes 13a, 13b and 13c. Also, a planarization layer 19 is formed on the transparent insulating interlayer 15 including the color filter layers 17a, 17b and 17c.

Then, micro lens 21 are formed on the planarization layer 19 corresponding to the color filter layers 17a, 17b and 17c to focus light thereto. At this time, the semiconductor substrate 10 is formed of a p-type single crystal silicon substrate, and the photodiodes 13a, 13b and 13c are formed of n-type diffusion regions. The photodiode array 13 may be replaced with a photo-gate array using a photo gate. Generally, the transparent insulating interlayer 15 is formed of an oxide layer. Also, the color filter layers 17a, 17b and 17c are formed of photosensitive layers using red, green and blue color dyes.

In case of the CMOS image sensor having the above-described structure, it is general to sequentially form the color filter layers 17a, 17b and 17c on the transparent insulating interlayer 15. More specifically, the photosensitive layer of red dye is coated on the insulating interlayer 15 in a spin-coating process, and then exposed with light and developed, so that the photosensitive layer remains in the color filter area of the insulating interlayer 15 positioned in perpendicular to the photodiode 13a, and the photosensitive layer in the other areas is completely removed, thereby forming the color filter layer 17a. In this manner, after forming the color filter layer 17b corresponding to the color filter area of the insulating interlayer 15 positioned in perpendicular to the photodiode 13b, the color filter layer 17c is formed in the color filter area of the insulating interlayer 15 positioned in perpendicular to the photodiode 13c.

In the related art, the coating, exposing and developing processes should each be repeated three times to form the color filter array 17 having the red, green, and blue color filter layers 17a, 17b and 17c, which not only complicates the fabrication process of the color filter array but also prevents the transmissivity of the red, green, and blue light rays each passing through the color filer layer from being uniformly maintained.

Recently, in order to resolve such problems of the color filter array, many alternative methods of sensing each of the red, green, and blue light rays without using the color filter have been proposed. Among the proposed methods, a method of using a micro prism is disclosed in the Korean Patent Application No. 10-2003-0056096. Also, a method of using a multiple slits is disclosed in the Korean Patent Application No. 10-2002-0039454. However, in the above-referenced methods, the fabrication processes of the micro prism and the multiple slits are very complicated and have many limitations in essentially resolving the problem of the complicated fabrication process of the CMOS image sensor.

SUMMARY OF THE INVENTION

Accordingly, the present invention is directed to a CMOS image sensor and a method for detecting color sensitivity that substantially obviates one or more problems due to limitations and disadvantages of the related art.

An object of the present invention is to provide a CMOS image sensor and a method for detecting color sensitivity that can easily sense red, green, and blue light by using a method of calculating a color sensitivity of red, green, and blue light in accordance with an optical wavelength within a depletion area from a width of the depletion area of a photodiode and a current value of an optical electric charge.

Another object of the present invention is to provide the simplified fabrication process of a CMOS image sensor by omitting the process of forming color filter layers.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a CMOS image sensor includes a semiconductor substrate having an active region; a photodiode formed in the active region of the semiconductor substrate, and generating an optical electric charge in accordance with irradiation of light; an insulating interlayer formed on an entire surface of the semiconductor substrate; and a micro lens formed on the insulating interlayer in perpendicular to the photodiode, wherein, a back-bias voltage is applied to the semiconductor substrate to vary a width of a depletion area of the photodiode.

At this time, the value of the back-bias voltage is corresponding to each wavelength of red, green and blue light.

Furthermore, the CMOS image sensor includes a back-bias voltage generation part converting the back-bias voltage to a plurality of different values; an optical electric charge transmission part formed in the active region of the semiconductor substrate, and transmitting the optical electric charge generated in the photodiode; and an optical color sensitivity calculation part formed in the active region of the semiconductor substrate, and calculating the color sensitivity of red, green and blue light in accordance with an optical wavelength within the depletion area from the width of the depletion area of the photodiode and a current value of the optical electric charge.

In addition, the CMOS image sensor includes a planarization layer between the insulating interlayer and the micro lens.

In another aspect, a CMOS image sensor includes a p-type semiconductor substrate having a plurality of active regions; a plurality of photodiodes formed in the respective active regions of the p-type semiconductor substrate, and converting light signals to electric signals; a plurality of p-type impurity regions formed on the p-type semiconductor substrate at one side in each photodiode; an insulating interlayer formed on the p-type semiconductor substrate; and a plurality of micro lens formed on the insulating interlayer corresponding to the photodiodes, wherein, different back-bias voltages are applied to the p-type impurity regions to vary a width of a depletion area in each photodiode.

At this time, each back-bias voltage applied to the p-type impurity region is corresponding to each wavelength of blue, green and red light.

Furthermore, the CMOS image sensor includes a planarization layer between the insulating interlayer and the micro lens.

In another aspect, a method for sensing optical color sensitivity of a CMOS image sensor, having a photodiode in an active region of a semiconductor substrate without forming a color filter layer, includes the steps of applying a first back-bias voltage to the semiconductor substrate so as to form a first width in a depletion area of the photodiode; measuring a first current value of an optical electric charge generated in the photodiode in accordance with the applied first back-bias voltage; applying a second back-bias voltage to the semiconductor substrate so as to form a second width in a depletion area of the photodiode; measuring a second current value of an optical electric charge generated in the photodiode in accordance with the applied second back-bias voltage; applying a third back-bias voltage to the semiconductor substrate so as to form a third width in a depletion area of the photodiode; measuring a third current value of an optical electric charge generated in the photodiode in accordance with the applied third back-bias voltage; and calculating the optical color sensitivity by calculating the measured first, second and third current values.

At this time, the first, second and third back-bias voltages are respectively corresponding to the wavelength of blue, green and red light.

Also, any one of the first, second, and third back-bias voltages is set as 0V.

In another aspect, a method for sensing optical color sensitivity of a CMOS image sensor, having at least three of first, second and third photodiodes, at least three of first, second and third impurity regions to apply a back-bias voltage to each photodiode without forming a color filter layer, includes the steps of applying first, second and third back-bias voltages different from one another to the first, second and third impurity regions; measuring first, second and third current values of optical electric charges generated in the first, second and third photodiodes in accordance with the applied first, second and third back-bias voltages; and calculating the color sensitivity of light by calculating the measured first, second and third current values.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a CMOS image sensor and a method for detecting color sensitivity according to the present invention will now be described with reference to the accompanying drawings.

Figure 1:
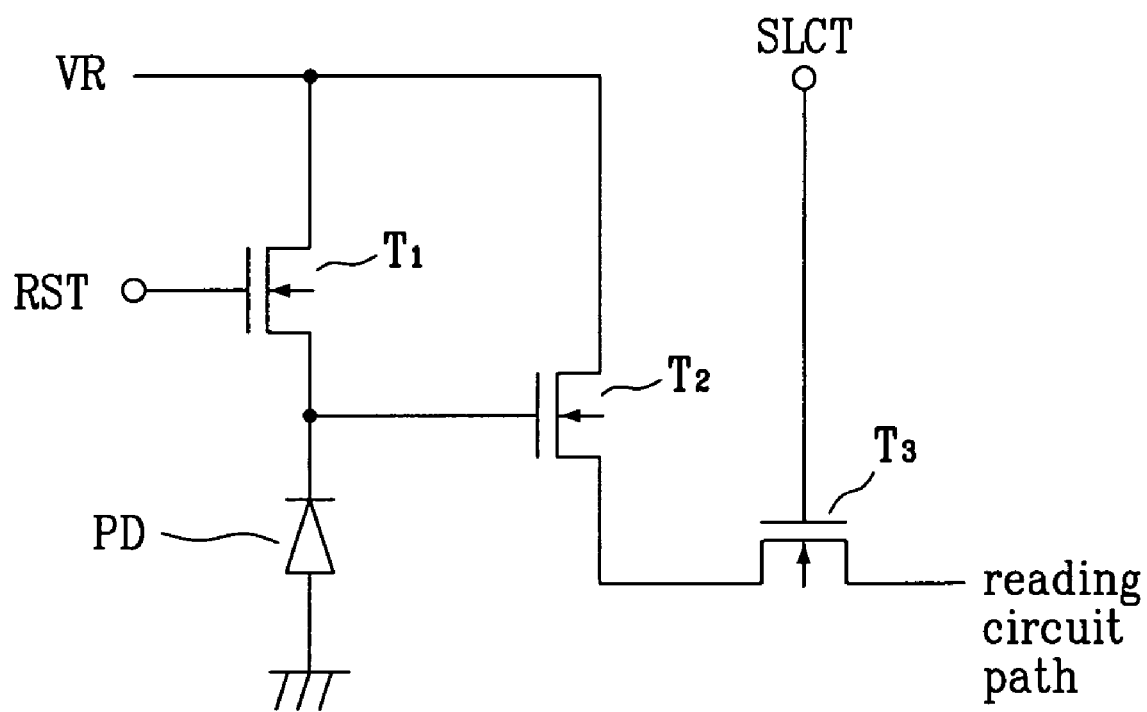
FIG. 1 is an equivalent circuit diagram of a unit pixel in a general CMOS image sensor.
Figure 2:
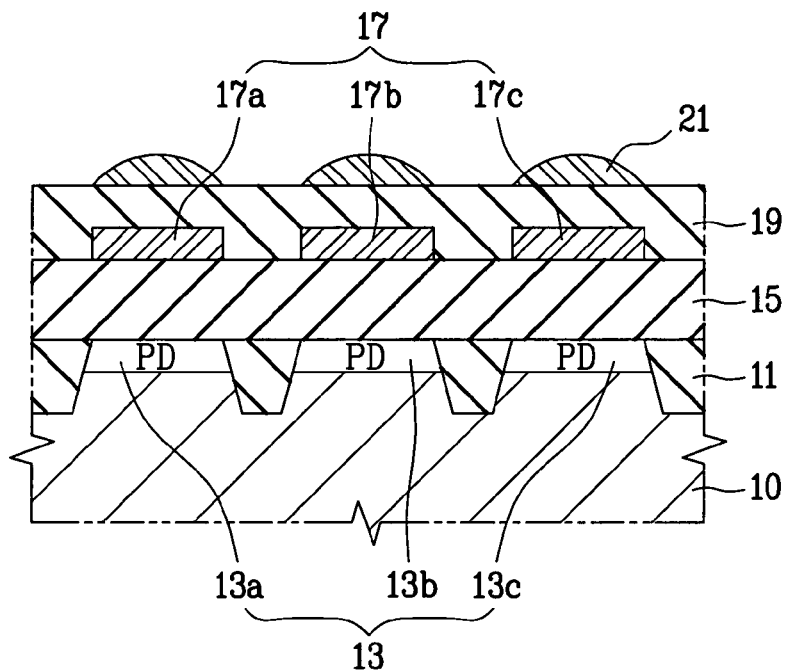
FIG. 2 is a cross-sectional view of a photodiode region in a related art CMOS image sensor.
Figure 3:
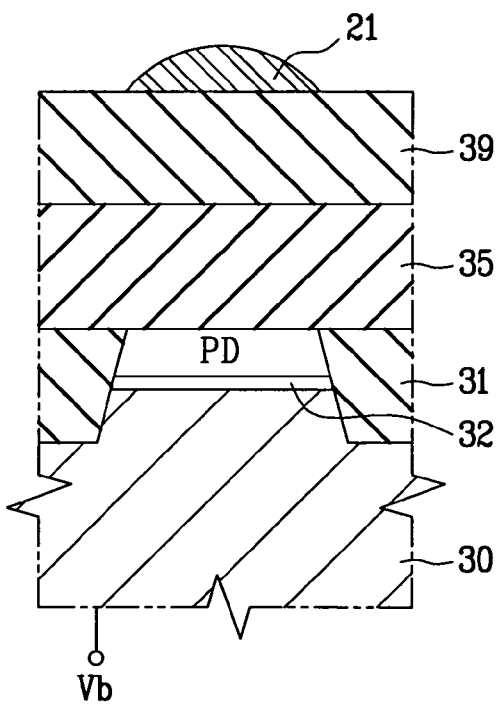
FIG. 3 is a cross-sectional view of a photodiode region in a CMOS image sensor according to the first embodiment of the present invention.

FIG. 3 is a cross-sectional view of a photodiode region in a CMOS image sensor according to the first embodiment of the present invention. In the CMOS image sensor according to the first embodiment of the present invention, as shown in FIG. 3, a p-type semiconductor substrate 30 is defined as a field region and an active region, and an isolation barrier 31 is formed in the field region. Also, a photodiode PD 33 is formed in a method of implanting n-type impurity ions to the active region of the p-type semiconductor substrate 30, wherein the photodiode PD 33 is provided to convert a light signal to an electric signal.

After that, a transparent insulating interlayer 35 is formed on an entire surface of the p-type semiconductor substrate 30 including the photodiode PD 33. Then, a planarization layer 39 is formed on the transparent insulating interlayer 35 to obtain planarization. Also, a concentration part, for example, micro lens 41 is formed on the planarization layer 39 corresponding to the photodiode PD 33, to concentrate external light into the photodiode PD 33. In this state, a back-bias voltage $V_b$ is supplied to the p-type semiconductor substrate 30.

At this time, the transparent insulating interlayer 35 may be formed of an oxide-based insulating layer having great transparency. In the drawings, the insulating interlayer 35 is formed as a single layer, for convenience of explanation. However, the insulating interlayer 35 may be formed of a plurality of layers. Also, in the drawings, the semiconductor substrate 30 is formed of the p-type single crystal silicon layer. However, it is possible to provide the semiconductor substrate 30 of a structure forming a p+ type epitaxial layer on the p-type single crystal silicon layer. Instead of the photodiode PD 33, a photo gate (not shown) may be used.

Although not shown, the active region of the semiconductor substrate 30 is formed of an optical electric charge transmission part, a back-bias ($V_b$) generation part, an optical color sensitivity calculation part, and an interpolation circuit part as well as the photodiode 33.

Figure 4:
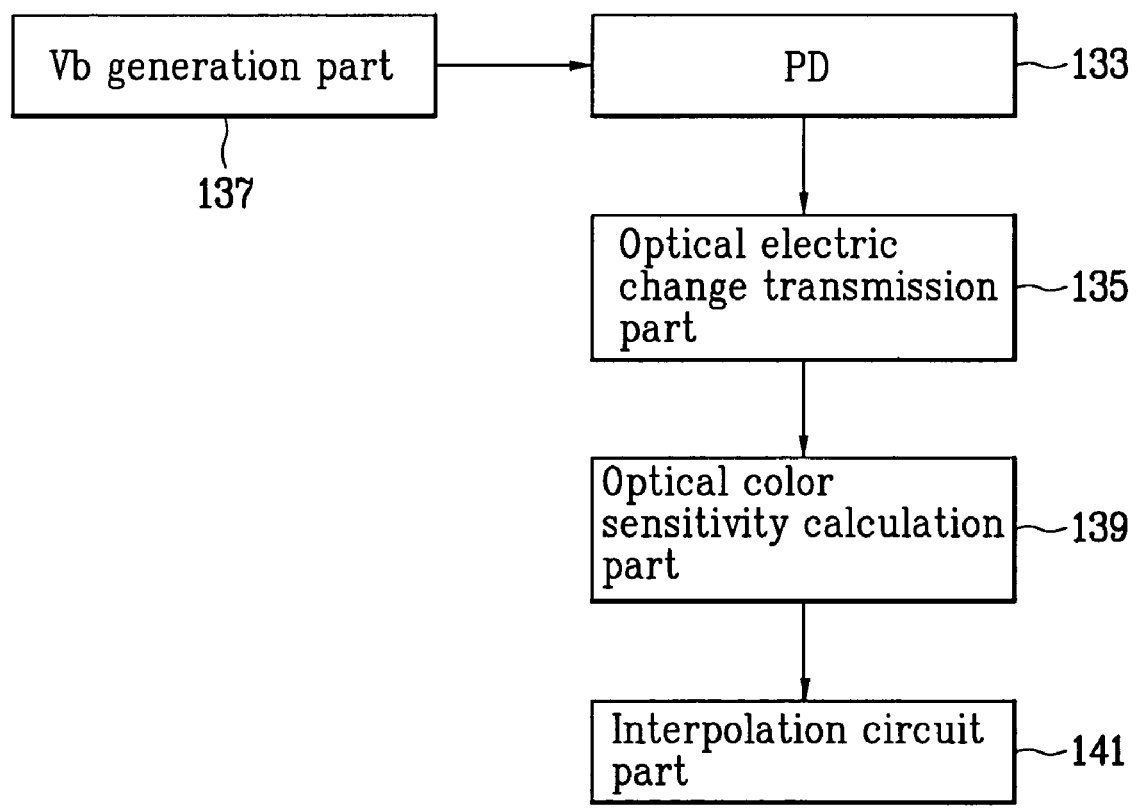
FIG. 4 is an equivalent circuit diagram of a signal process part in a CMOS image sensor according to the present invention.

FIG. 4 is a block diagram of a signal processing part in a CMOS image sensor according to the present invention. Referring to FIG. 4, a photodiode 133 generates a plurality of optical electric charges corresponding to a predetermined current value by irradiation of external light (not shown). Also, an optical electric charge transmission part 135 is generally formed of three transistors or four transistors, the optical electric charge transmission part 135 transmitting the optical electric charge to an optical color sensitivity calculation part 139. Then, a back-bias ($V_b$) generation part 137 applies a back-bias voltage ($V_b$) to the semiconductor substrate 30 of FIG. 3, having the photodiode 133.

After that, the optical color sensitivity calculation part 139 calculates a current value by using the transmitted optical electric charge, and color sensitivity of red, green and blue light by using a variable width of a depletion area of the photodiode 133 in accordance with variation of the back-bias voltage ($V_b$). Also, the interpolation circuit part 141 interpolates a signal corresponding to the calculated color sensitivity of the red, green and blue light, thereby obtaining a color signal corresponding to a color image.

The process of calculating the color sensitivity in the optical color sensitivity calculation part 139 will be described in detail.

Figure 5A:
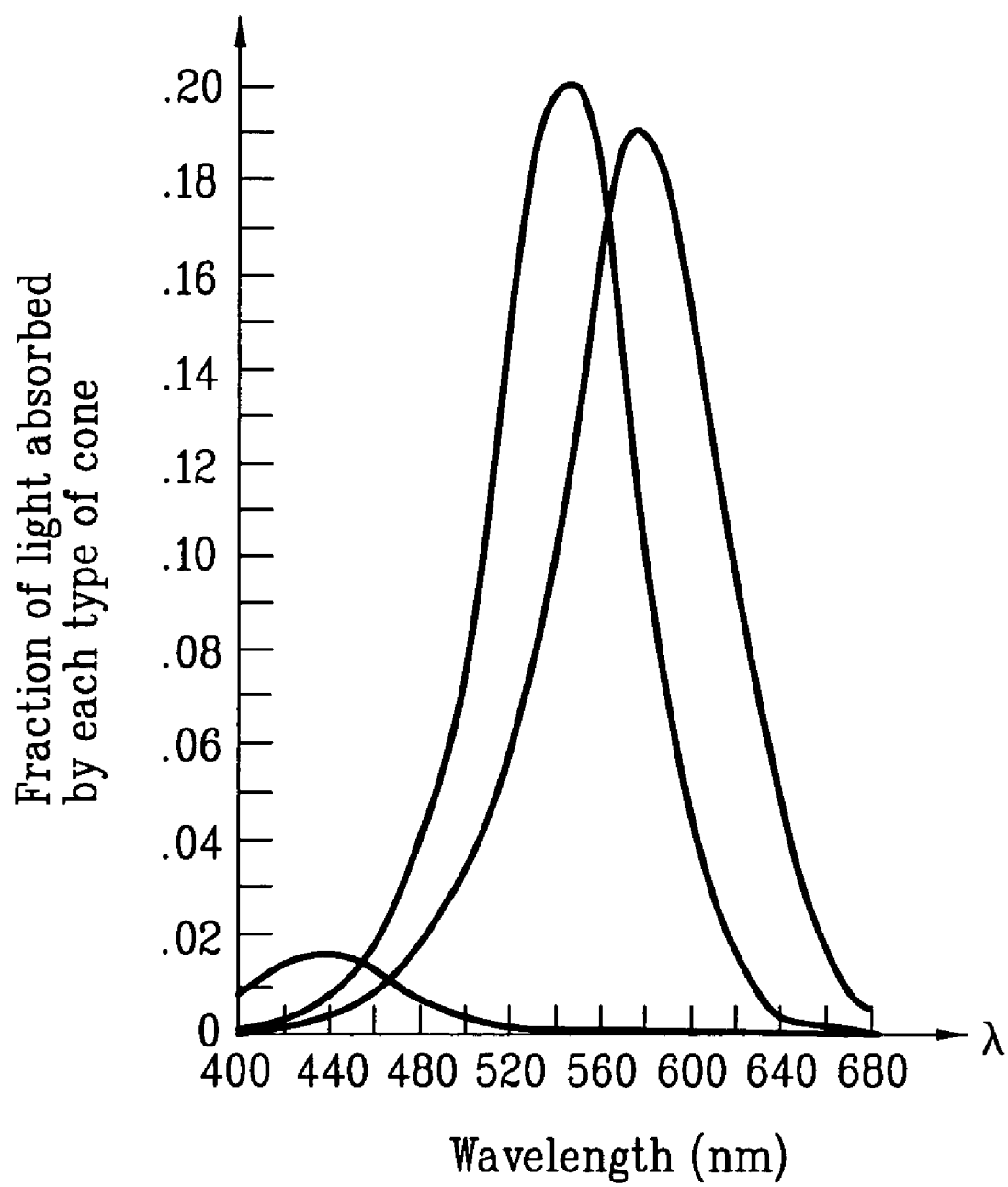
FIG. 5A is a graph illustrating a fraction of light absorbed by a wavelength of red, green and blue in a CMOS image sensor according to the present invention.
Figure 5B:
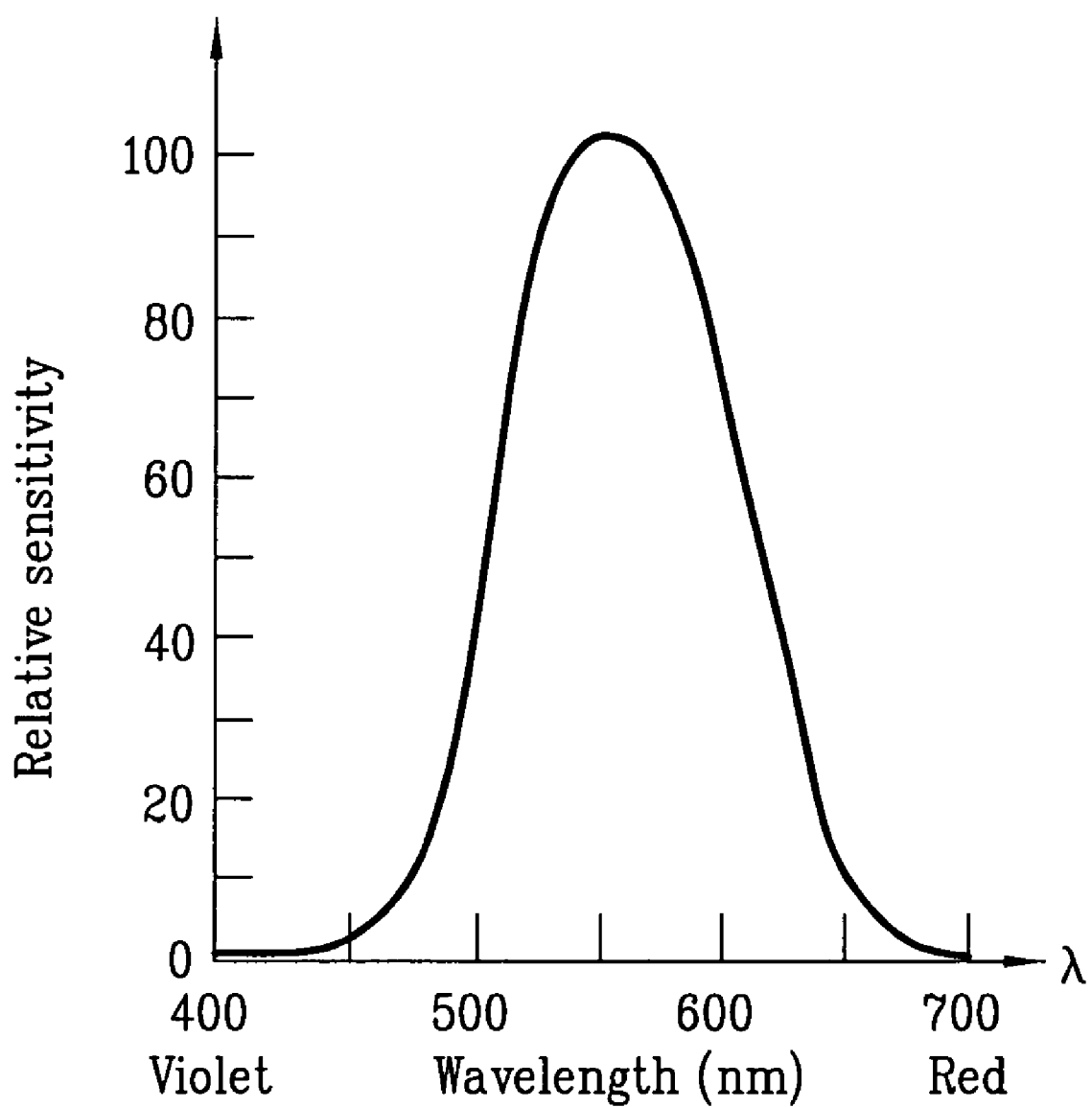
FIG. 5B is a graph illustrating color sensitivity according to a wavelength of light adding red, green and blue in a CMOS image sensor according to the present invention.
Figure 6:
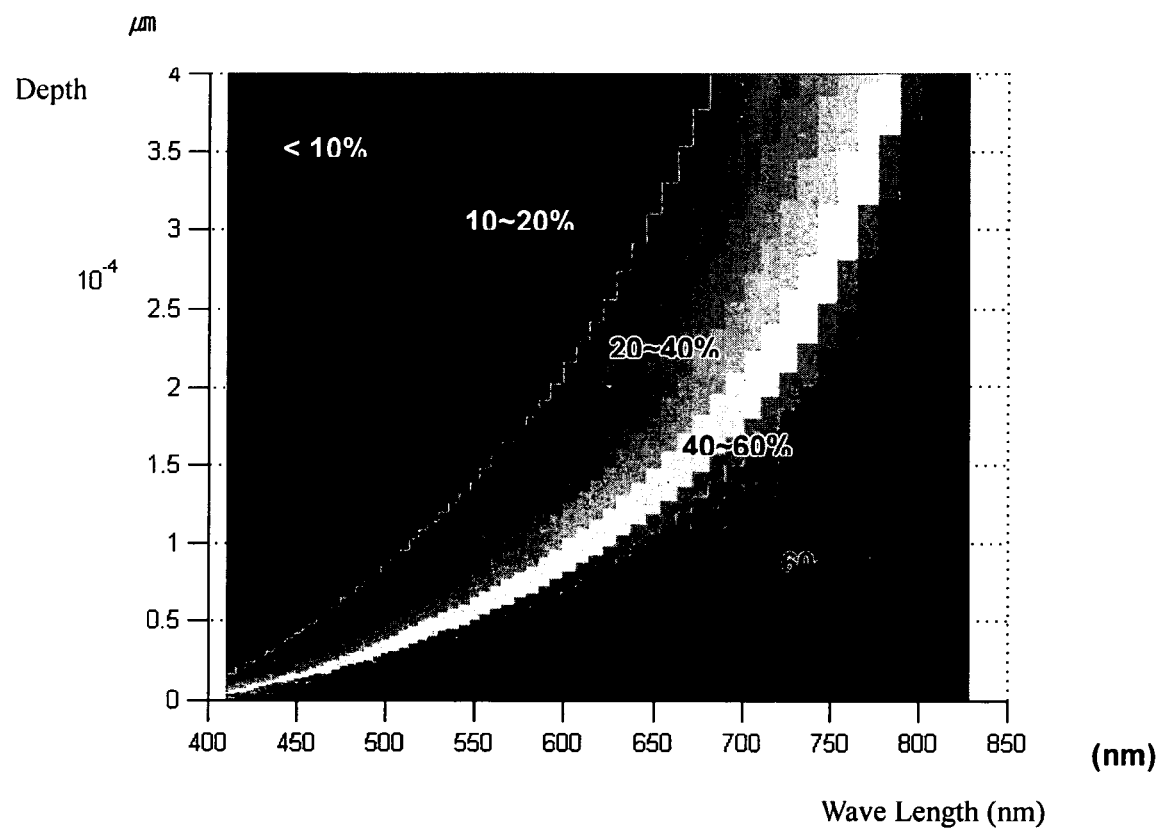
FIG. 6 is a graph illustrating a penetration depth of a silicon substrate according to a wavelength of light in a CMOS image sensor according to the present invention.

FIG. 5A is a graph illustrating a fraction of light absorbed by a wavelength of red, green and blue light in a CMOS image sensor according to the present invention. FIG. 5B is a graph illustrating color sensitivity according to a wavelength of light mixing red, green and blue color in a CMOS image sensor according to the present invention. FIG. 6 is a graph illustrating a penetration depth of a silicon substrate according to a wavelength of light in a CMOS image sensor according to the present invention.

First, the fraction of light absorbed by each wavelength of red, green and blue light is shown in FIG. 5A. That is, the blue (B) light having a band of the wavelength of 440 nm to 480 nm has a relatively low fraction of light absorbed, and the green (G) light having a band of the wavelength of 520 nm to 560 nm and the red (R) light having a band of the wavelength of 660 nm to 700 nm have a relatively high fraction of light absorbed. Also, the sensitivity in accordance with the wavelength of light mixing the red, green and blue color is distributed as shown in FIG. 5B.

In addition, the penetration depth of the silicon substrate in accordance with the wavelength of light is shown in FIG. 6. That is, the blue (B) light having the short wavelength penetrates into the silicon substrate shallowly, and the green (G) and red (R) light having the long wavelength penetrates into the silicon substrate deeply. Accordingly, the penetration depth of the silicon substrate is varied in accordance with the wavelength of light. In this respect, it is analogized that the wavelength of light is differently sensed in accordance with PN junction depth of the photodiode. However, the process of varying the PN junction depth in each photodiode is complicated. In the present invention, it is possible to control the depletion area of PN junction of the photodiode by controlling the back-bias voltage applied to the semiconductor substrate. That is, a method for sensing the light in accordance with each wavelength is used in the present invention.

That is, as shown in FIG. 3, the back-bias voltage is applied to the semiconductor substrate 30 forming the PN junction of the photodiode 33, so that the depletion area 32 is formed in the PN junction of the photodiode 33. The back-bias voltage applied to the semiconductor substrate 30 influences on the width (W) of the depletion area 32. This will be expressed in the following equation 1.

$$W=[\{2Ks\epsilon_0(\Phi_B \pm |V_b|)\}/qN_A]^{1/2} \qquad \text{equation 1,}$$

wherein, 'Ks' is a relative dielectric constant of a semiconductor, '$\epsilon_0$' is a permittivity of a free space, '$\Phi_B$' is a metal-semiconductor energy barrier, 'q' is a charge on an electron, '$N_A$' is a an acceptor impurity concentration, and '$V_b$' is the back-bias voltage. In this manner, the width of the depletion area formed in the PN junction of the photodiode is varied in accordance with the back-bias voltage ($V_b$).

Also, the current value (A) by the optical electric charge generated in the depletion area is expressed in the following equation 2.

$$A = \frac{1}{2} q(n_1/\tau) W A j \qquad \text{equation 2,}$$

wherein, 'Aj' is a cross-sectional area of the PN junction of the photodiode, 'W' is the width of the depletion area, '$n_1$' is an intrinsic carrier concentration, and 'q' is a charge on an electron.

Accordingly, a predetermined voltage, the back-bias voltage, is supplied to the semiconductor substrate, and the color sensitivity by the wavelength of the red, green and blue light within the depletion area is obtained in accordance with the above-equations 1 and 2. That is, the first, second and third back-bias voltages $V_b1$, $V_b2$ and $V_b3$ different from one another are supplied to the semiconductor substrate 30 of FIG. 3 by the back-bias voltage ($V_b$) generation part 137 of FIG. 4, whereby the width of the depletion area is formed of a first width W1 by the first back-bias voltage $V_b1$, a second width W2 by the second back-bias voltage $V_b2$, and a third width W3 by the third back-bias voltage $V_b3$.

At this time, since the width of the depletion area is controlled by the back-bias voltage, and the sensed wavelength of light is varied according to the width of the depletion area, it is required to control the first, second and third back-bias voltages $V_b1$, $V_b2$ and $V_b3$ as values corresponding to each wavelength of blue, green and red light. Also, since the width of the depletion area is varied according to the back-bias voltage, it is possible to calculate the color sensitivity (IR), (IG) and (IB) in accordance with the wavelength of blue (B), green (G) and red (R) light. At this time, any one of the first, second and third back-bias voltages $V_b1$, $V_b2$ and $V_b3$ is determined as 0V, and the remaining two are determined as predetermined values.

By inducement of the equations 1 and 2, it is possible to calculate the color sensitivity (IR), (IG) and (IB) in accordance with the wavelength of light.

$$I(W1)=A(W1)=IR \exp(-\lambda RW1)+IB \exp(-\lambda BW1)+IG \exp(-\lambda GW1)$$

$$I(W2)=A(W2)=IR \exp(-\lambda RW2)+IB \exp(-\lambda BW2)+IG \exp(-\lambda GW2)$$

$$I(W3)=A(W3)=IR \exp(-\lambda RW3)+IB \exp(-\lambda BW3)+IG \exp(-\lambda GW3) \qquad \text{equation 3}$$

wherein, each of 'W1', 'W2' and 'W3' is the width of the depletion area by applying the first, second and third back-bias voltages $V_b1$, $V_b2$ and $V_b3$. Also, R/G/B are the wavelengths of the red, green and blue color light, and I(W1), I(W2) and I(W3) are color sensitivity calculation values in accordance with the widths (W1), (W2) and (W3) of the depletion area.

Accordingly, the sensitivity (I(W1)) is calculated from each photodiode 33 by applying the first back-bias voltage $V_b1$ to the semiconductor substrate 30, the sensitivity (I(W2)) is calculated from each photodiode 33 by applying the second back-bias voltage $V_b2$ to the semiconductor substrate 30, and the sensitivity (I(W3)) is calculated from each photodiode 33 by applying the third back-bias voltage $V_b3$ to the semiconductor substrate 30. Then, by adding up the sensitivities calculated in each photodiode 33, it is possible to calculate the color sensitivity detected in each photodiode.

As explained above, the optical color sensitivity calculation part 139 calculates and senses the color sensitivity of red, green and blue light irradiated to the photodiode 133 in the sequence process without using red, green and blue color filters, so that it is possible to obtain the simplified fabrication process of forming the CMOS image sensor by omitting the process of fabricating the red, green and blue color filters. Also, it is possible to maintain the uniform transmissivity of the red, green and blue light since the red, green and blue color filters are not used in the CMOS image sensor according to the present invention.

In the photodiode structure according to the first embodiment of the present invention, it is possible to detect the color sensitivity of red (R), green (G) and blue (B) light in one photodiode, thereby improving integration. That is, in the related art CMOS image sensor, one pixel is formed of three photodiodes of R/G/B. Meanwhile, in case of the CMOS image sensor according to the first embodiment of the present invention, one photodiode detects the color sensitivity of R/G/B light, whereby the integration of the present invention is three times as high as the integration of the related art.

Meanwhile, without forming color filter layers, widths of depletion area are varied by applying different back-bias voltages to the respective red, green and blue photodiodes, to detect light. This method will be described with reference to FIG. 7.

Figure 7:
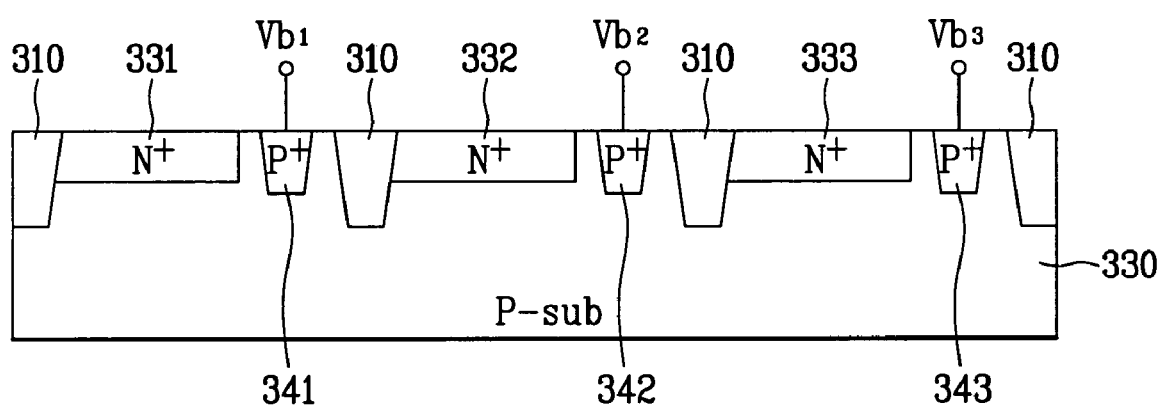
FIG. 7 is a cross-sectional view of a photodiode region in a CMOS image sensor according to the second embodiment of the present invention.

FIG. 7 is a cross-sectional view of a CMOS image sensor according to the second embodiment of the present invention, and FIG. 7 shows only photodiode regions. In the CMOS image sensor according to the second embodiment of the present invention, a p-type semiconductor substrate 300 is defined as an active region and a field region, and an isolation barrier 310 is formed in the field region. Then, highly doped p-type impurity ions are implanted into a predetermined portion of the active region of the semiconductor substrate 30, whereby a plurality (at least three) of photodiodes PD 331, 332 and 333 are formed to convert a light signal to an electric signal. Then, highly-doped p-type impurity ions are implanted into the active region of the semiconductor substrate 300, having no photodiodes 331, 332 and 333, thereby forming p-type impurity regions 341, 342 and 343 for applying back-bias voltages to the respective photodiodes 331, 332 and 333.

Although not shown, a transparent insulating interlayer (for reference, '35' of FIG. 3) and a planarization layer (for reference, '39' of FIG. 3) are formed on an entire surface of the semiconductor substrate 30 including the photodiodes 331, 332 and 333 and the p-type impurity regions 341, 342 and 343. Then, concentration parts, such as micro lens (for reference, '41' of FIG. 3), are formed on the planarization layer corresponding to the photodiodes 331, 332 and 333.

At this time, the different back-bias voltages are applied to the respective p-type impurity regions 341, 342 and 343. That is, the first back-bias voltage $V_b1$ is applied to the first p-type impurity region 341, the second back-bias voltage $V_b2$ is applied to the second p-type impurity region 342, and the third back-bias voltage $V_b3$ is applied to the third p-type impurity region 343.

When the different back-bias voltages are applied to the respective photodiodes, as described above, depletion areas having different widths are formed in PN junction parts of the respective photodiodes. That is, according to the back-bias voltage, the depletion area having great sensitivity to the blue light is formed in the first photodiode 331, the depletion area having great sensitivity to the green light is formed in the second photodiode 332, and the depletion area having great sensitivity to the red light is formed in the third photodiode 333. In this manner, the blue, green and red light is detected in each photodiode, whereby it is possible to detect the light in the method according to the related art.

As mentioned above, the CMOS image sensor according to the present invention and the method for detecting the color sensitivity thereof have the following advantages.

First, it is possible to detect the color sensitivity of red, green and blue light irradiated to the photodiode without forming the color filter, thereby simplifying the fabrication process of the CMOS image sensor by omitting the process of forming the red, green and blue color filters.

Since the color filters are not formed in the CMOS image sensor according to the present invention, it is possible to maintain the uniform transmissivity of red, green and blue light.

Also, without using the color filter, it is possible to detect the color sensitivity of red (R), green (G) and blue (B) light within one photodiode in the method of varying the width of the depletion area of the photodiode by controlling the back-bias voltage applied to the semiconductor substrate, thereby improving integration.

In addition, the different back-bias voltages are applied to the respective photodiodes, so as to vary the width of the depletion area to be in correspondence with the penetration depth of the wavelength of red, green and blue light, thereby detecting the color sensitivity without forming the color filters in the respective red, green and blue photodiodes.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A CMOS image sensor comprising:
a semiconductor substrate having an active region;
a photodiode formed in the active region of the semiconductor substrate, and generating an optical electric charge in accordance with irradiation of light;
an insulating interlayer formed on an entire surface of the semiconductor substrate; and
a micro lens formed on the insulating interlayer in perpendicular to the photodiode,
wherein, a back-bias voltage is applied to the semiconductor substrate to vary a width of a depletion area of the photodiode and the value of the back-bias voltage corresponds to a wavelength of red, green or blue light.

2. The CMOS image sensor of claim 1, further comprising:
a back-bias voltage generation part converting the back-bias voltage to a plurality of different values;
an optical electric charge transmission part formed in the active region of the semiconductor substrate, and transmitting the optical electric charge generated in the photodiode; and
an optical color sensitivity calculation part formed in the active region of the semiconductor substrate, and calculating the color sensitivity of red, green and blue light in accordance with an optical wavelength within the depletion area from the width of the depletion area of the photodiode and a current value of the optical electric charge.

3. The CMOS image sensor of claim 1, further comprising a planarization layer between the insulating interlayer and the micro lens.

4. A CMOS image sensor comprising:
a p-type semiconductor substrate having a plurality of active regions;
a plurality of photodiodes formed in the respective active regions of the p-type semiconductor substrate, and converting light signals to electric signals;
a plurality of p-type impurity regions formed on the p-type semiconductor substrate at one side in each photodiode;
an insulating interlayer formed on the p-type semiconductor substrate; and
a plurality of micro lens formed on the insulating interlayer corresponding to the photodiodes,
wherein, different back-bias voltages are applied to the p-type impurity regions to vary a width of a depletion area in each photodiode and the back-bias voltages applied to the p-type impurity region each correspond to a wavelength of blue, green and red light.

5. The CMOS image sensor of claim 4, further comprising a planarization layer between the insulating interlayer and the micro lens.

6. A method for sensing optical color sensitivity of a CMOS image sensor, having a photodiode in an active region of a semiconductor substrate without forming a color filter layer, comprising:
applying a first back-bias voltage to the semiconductor substrate so as to form a first width in a depletion area of the photodiode;
measuring a first current value of an optical electric charge generated in the photodiode in accordance with the applied first back-bias voltage;
applying a second back-bias voltage to the semiconductor substrate so as to form a second width in a depletion area of the photodiode;
measuring a second current value of an optical electric charge generated in the photodiode in accordance with the applied second back-bias voltage;

applying a third back-bias voltage to the semiconductor substrate so as to form a third width in a depletion area of the photodiode;

measuring a third current value of an optical electric charge generated in the photodiode in accordance with the applied third back-bias voltage; and calculating the optical color sensitivity by applying the measured first, second and third current values.

7. The method of claim 6, wherein the first, second and third back-bias voltages are respectively corresponding to the wavelength of blue, green and red light.

8. The method of claim 6, wherein any one of the first, second and third back-bias voltages is set as 0V.

9. A method for sensing optical color sensitivity of a CMOS image sensor, having at least a first, a second and a third photodiode, at least a first, a second and a third impurity region to apply a back-bias voltage to each photodiode without forming a color filter layer, comprising:

applying first, second and third back-bias voltages different from one another to the first, second and third impurity regions;

measuring first, second and third current values of optical electric charges generated in the first, second and third photodiodes in accordance with the applied first, second and third back-bias voltages; and calculating the color sensitivity of light by applying the measured first, second and third current values.

10. The method of claim 9, wherein the first, second and third back-bias voltages are respectively corresponding to the wavelength of blue, green and red light.

11. The method of claim 9, wherein any one of the first, second and third back-bias voltages is set as 0V.

* * * * *